United States Patent
Saito et al.

(10) Patent No.: US 9,646,933 B2
(45) Date of Patent: May 9, 2017

(54) SEMICONDUCTOR DEVICE AND MANUFACTURING METHOD THEREOF

(71) Applicant: KABUSHIKI KAISHA TOSHIBA, Minato-ku, Tokyo (JP)

(72) Inventors: Tatsuro Saito, Yokkaichi Mie (JP); Atsunobu Isobayashi, Yokkaichi Mie (JP); Akihiro Kajita, Yokkaichi Mie (JP); Tadashi Sakai, Yokohama Kanagawa (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 0 days.

(21) Appl. No.: 15/067,116

(22) Filed: Mar. 10, 2016

(65) Prior Publication Data
US 2017/0062345 A1 Mar. 2, 2017

(30) Foreign Application Priority Data
Sep. 2, 2015 (JP) ................. 2015-173173

(51) Int. Cl.
*H01L 21/00* (2006.01)
*H01L 23/532* (2006.01)
*H01L 23/522* (2006.01)
*H01L 21/768* (2006.01)

(52) U.S. Cl.
CPC .. *H01L 23/53276* (2013.01); *H01L 21/76805* (2013.01); *H01L 21/76864* (2013.01); *H01L 21/76879* (2013.01); *H01L 23/5226* (2013.01)

(58) Field of Classification Search
CPC .......... H01L 23/53276; H01L 23/5226; H01L 21/76879
See application file for complete search history.

(56) References Cited

U.S. PATENT DOCUMENTS

| 8,410,608 | B2 | 4/2013 | Wada et al. |
| 8,648,464 | B2 | 2/2014 | Kitamura et al. |
| 8,907,495 | B2 | 12/2014 | Wada et al. |
| 9,117,885 | B2 * | 8/2015 | Saito ................ H01L 21/28556 |
| 2009/0257270 | A1 * | 10/2009 | Schricker ................ H01L 45/04 365/148 |
| 2009/0283735 | A1 * | 11/2009 | Li ........................... H01L 45/04 257/1 |
| 2011/0006425 | A1 * | 1/2011 | Wada ................ H01L 21/76807 257/750 |

(Continued)

FOREIGN PATENT DOCUMENTS

JP 2012054303 A 3/2012

*Primary Examiner* — Laura Menz
(74) *Attorney, Agent, or Firm* — Holtz, Holtz & Volek PC

(57) ABSTRACT

According to one embodiment, a semiconductor device includes a first insulating layer on an underlying layer, a first trench formed in the first insulating layer, and a first graphene layer provided in the first trench. The first trench comprises a bottom surface on the underlying and two side surfaces joined to the bottom surface, formed into a U-shape. The first graphene layer has a stacked structure including a plurality of graphene sheets. The plurality of graphene sheets each include a depression in a central portion. Portions of the graphene sheets located in an edge of the first graphene layer are each extended upward, which is in a direction opposite to the bottom surface.

17 Claims, 10 Drawing Sheets

(56) References Cited

U.S. PATENT DOCUMENTS

| | | | |
|---|---|---|---|
| 2014/0106561 A1* | 4/2014 | Niyogi | C23C 14/042 |
| | | | 438/643 |
| 2014/0191400 A1* | 7/2014 | Chien | H01L 23/53233 |
| | | | 257/751 |
| 2015/0357189 A1* | 12/2015 | Davis | H01L 21/28512 |
| | | | 257/29 |
| 2016/0276281 A1* | 9/2016 | Sato | H01L 23/53276 |
| 2017/0018614 A1* | 1/2017 | Rupp | H01L 29/1608 |

* cited by examiner

F I G. 13

| The structure of the thick interconnect 20b | | | | | | | | |
|---|---|---|---|---|---|---|---|---|
| Having the adhesive layer 21 | | | Without the adhesive layer 21 | | | | | |
| | Structure 1-2 | | | Structure 2-2 | | Structure 2-4 | | |
| | | | Structure 1-1 | Structure 2-1 | | Structure 2-3 | | Structure 2-5 |
| | | | First embodiment | Second embodiment | | | | |
| Process | | | | | | | | |
| (1) | 14b | | 14b | 14b | | 14b | | 14b |
| (2) | (21),22 | | (21),22 | (21),22 | | (21),22 | | (21),22 |
| (3) | X (Process skip) | | 30 | 30 | | 24 | | 24 |
| (4) | 23 | | 23 | 23 | | X (Process skip) | | 30 |
| (5) | 30 Removal | | 30 Removal | 24 | | 30 | | 23 |
| (6) | — | | | 30 Removal | | 30 Removal | | 30 Removal |

SEMICONDUCTOR DEVICE AND MANUFACTURING METHOD THEREOF

CROSS-REFERENCE TO RELATED APPLICATIONS

This application is based upon and claims the benefit of priority from Japanese Patent Application No. 2015-173173, filed Sep. 2, 2015, the entire contents of which are incorporated herein by reference.

FIELD

Embodiments described herein relate generally to a semiconductor device and a manufacturing method thereof.

BACKGROUND

A graphene sheet, which is, as carbon nanotube, a novel carbon material that exhibits quantized conduction (ballistic conduction), and is attracting attention as a revolutionary low-resistance interconnect as an alternative to metal interconnects. Because the average mean free path of the electrons in a graphene sheet is great, being about 100 nm to about 1 μm, the graphene sheet is, in terms of electrical conduction, highly advantageous for long distance interconnection. A graphene sheet is formed by a thermal reaction between a catalytic metal layer and a carbon layer. But, there has been a problem that the conductivity of a graphene sheet decreases to approximately a half when a catalytic metal is brought into contact with the surface of the graphene sheet. Under these circumstances, there is a demand for a graphene sheet having a lower resistance.

BRIEF DESCRIPTION OF THE DRAWINGS

FIG. 13 is a diagram showing steps of the manufacturing processes according to the first and second embodiments.

DETAILED DESCRIPTION

In general, according to one embodiment, a semiconductor device comprises a first insulating layer on an underlying layer, a first trench formed in the first insulating layer, and a first graphene layer provided in the first trench. The first trench comprises a bottom surface on the underlying and two side surfaces joined to the bottom surface, formed into a U-shape. The first graphene layer has a stacked structure including a plurality of graphene sheets. The plurality of graphene sheets each includes a depression in a central portion. Portions of the graphene sheets located in an edge of the first graphene layer are each extended upward, which is in a direction opposite to the bottom surface.

Embodiments will now be described with reference to accompanying drawings.

First Embodiment

Figure 1:
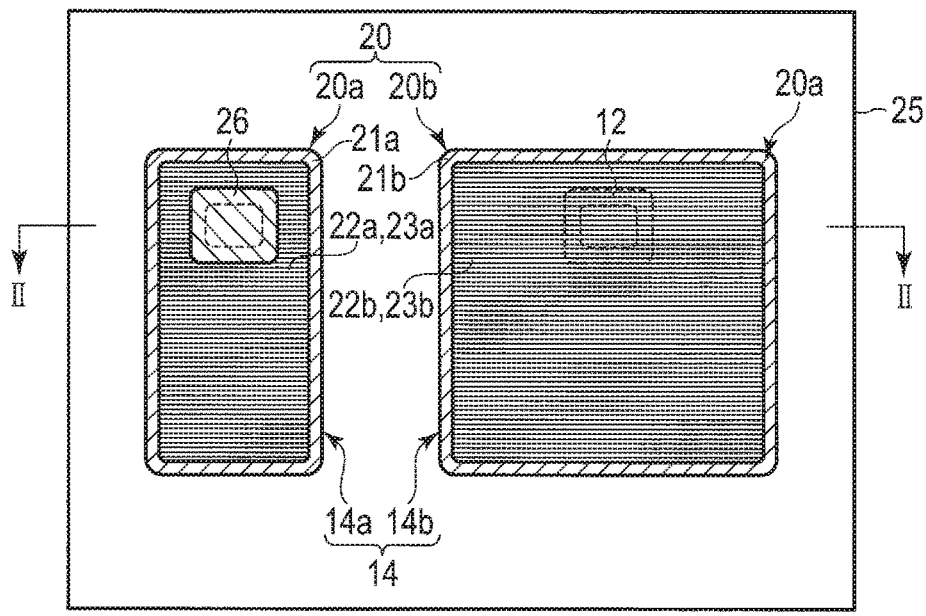
FIG. 1 is a plan new showing a schematic structure of a semiconductor device according to the first embodiment.
Figure 2:
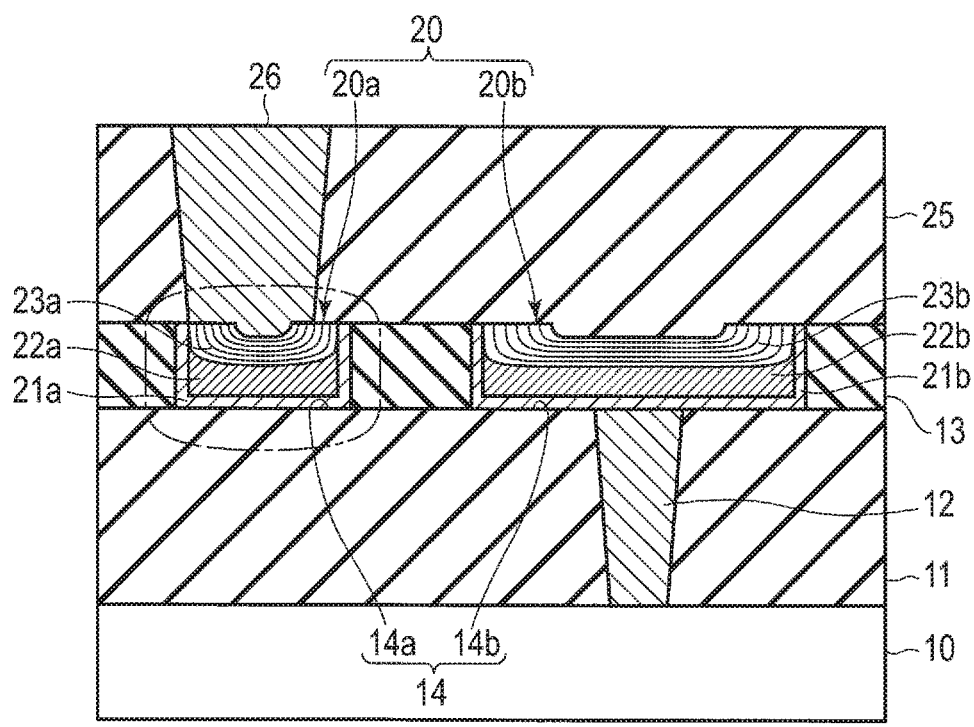
FIG. 2 is a sectional view taken along line II-II in FIG. 1.

FIG. 1 is a plan view showing a schematic structure of a semiconductor device according to the first embodiment. FIG. 2 is a sectional view taken along line II-II in FIG. 1. The semiconductor device of this embodiment is applicable to the latest semiconductor integrated circuit.

As shown in the figures, the semiconductor device according to the first embodiment comprises a semiconductor substrate 10 on which semiconductor devices such as transistors and capacitors are formed on underlying layer 11 formed on the semiconductor substrate 10, a first contact/via 12 embedded in the underlying layer 11, a first insulating layer 13 formed on the underlying layer 11, a trench 14 formed in the first insulating layer 13, an interconnection layer 20 formed in the trench 14, a second insulating layer 25 formed on the first insulating layer 13, and a second contact/via 26 embedded in the second insulating layer 25.

The semiconductor substrate 10 is, for example, a silicon semiconductor substrate. The underlying layer 11 and the first and second insulating layers are interlayer insulation layers containing, mainly, silicon oxide, silicon nitride, air gap and the like. The first and second contact/via plugs 12 and 26 are each, for example, copper, aluminum, tungsten or an alloy containing one or more of these elements.

The trench 14 is selectively formed on a wiring pattern including the first and second contact/via plugs 12 and 26. The trench 14 includes a narrow trench 14a (first trench) having a trench width less than or equal to a predetermined width and a wide trench 14b (second trench) having a trench width greater than a predetermined width.

The interconnection layer 20 is formed in the narrow trench 14a, and includes a thin interconnect 20a (first interconnect) having a line width less than or equal to a predetermined width and a thick interconnect 20b (second interconnect) formed in the wide trench 14b and having a line width greater than a predetermined width.

Figure 3:
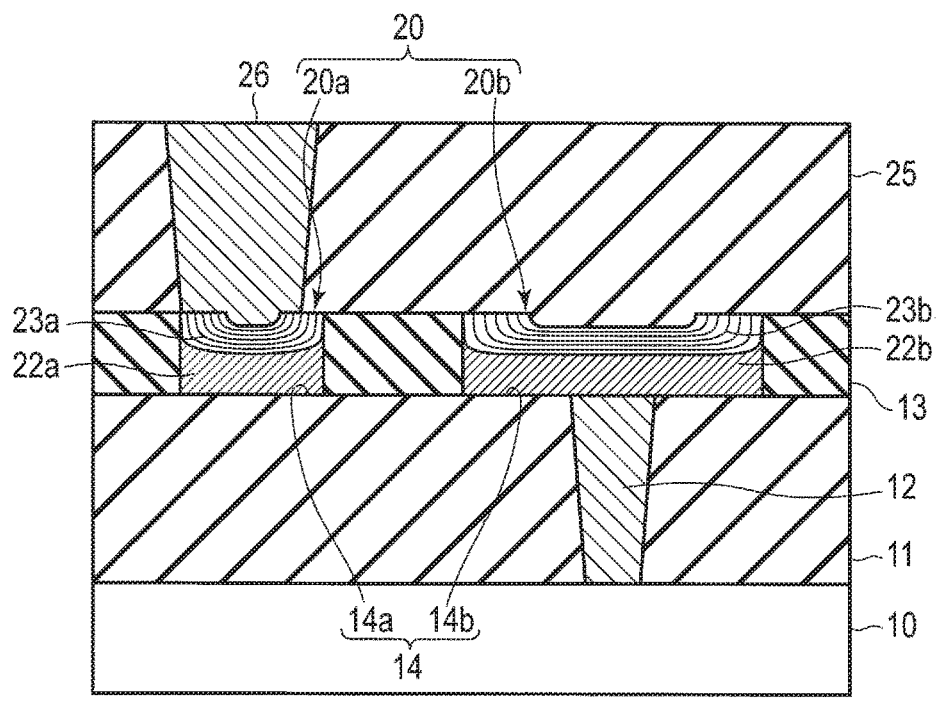
FIG. 3 is a sectional view showing a schematic structure of the semiconductor device according to the first embodiment.

The thin interconnect 20a comprises a first adhesive layer 21a, a first carbon layer 22a and a first graphene layer 23a as a interconnection materials which has a line width less than or equal to a predetermined width. The thick interconnect 20h comprises a second adhesive layer 21b, a second carbon layer 22h and a second graphene layer 23b as a interconnection material having a line width greater than a predetermined width. But, when first and second graphene layers 23a and 23b and the first insulating layer 13 (the narrow trench 14a and the wide trench 14b) exhibit excellent adhesion, the first and second adhesive layers 21a and 21b need not be provided as shown in FIG. 3. In the following description, the predetermined width is set to, for example, 10 nm.

Figure 4:
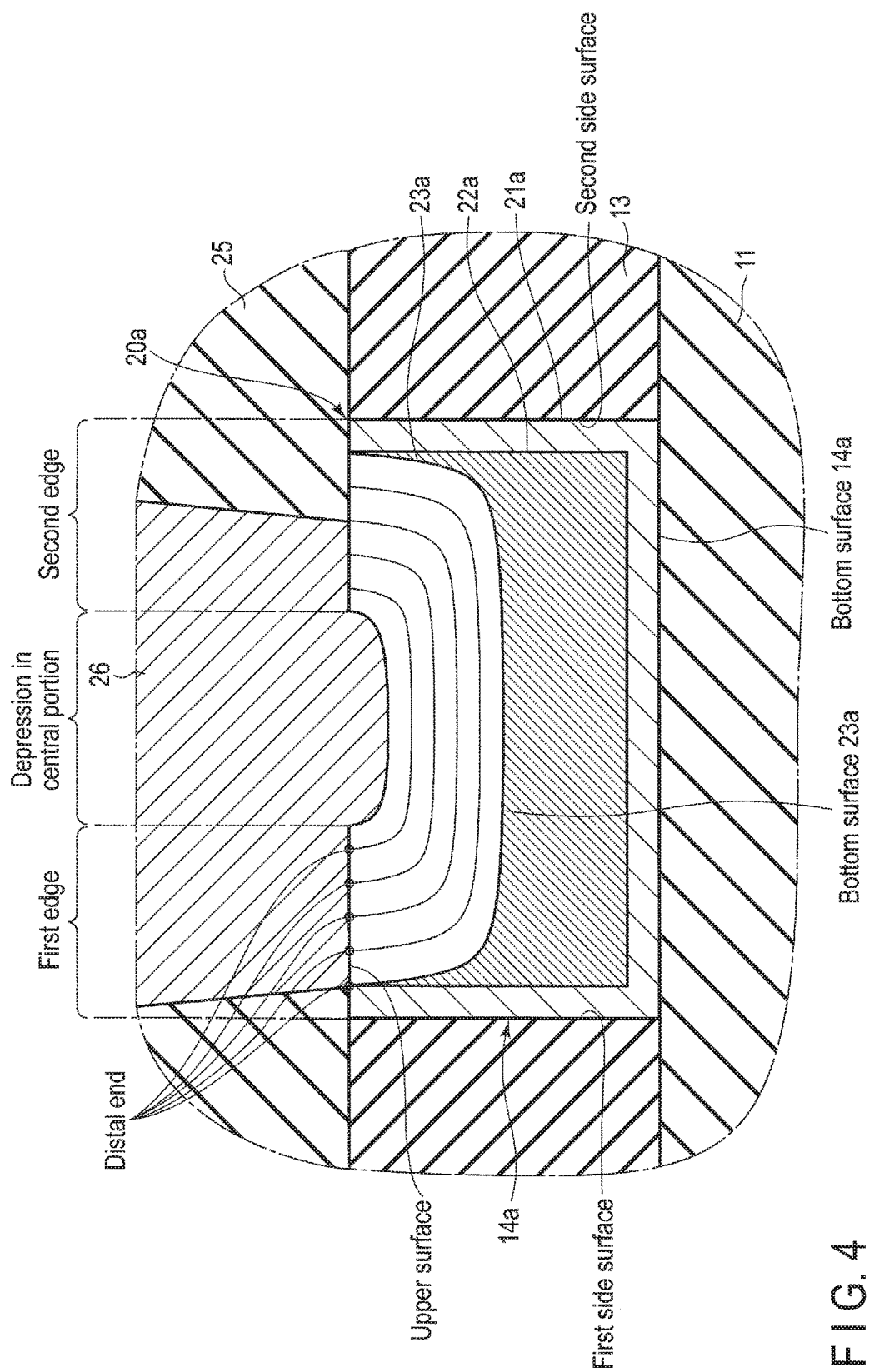
FIG. 4 is an enlarged view of the portion indicated by dashed line in FIG. 2.

FIG. 4 is an enlarged view of the section indicated by the dashed line in FIG. 2.

The narrow trench 14a has a U-shape constituted by the bottom surface (of the 14a) on the underlying layer 11, and the first and second side surfaces connected to the bottom surface (of the 14a). The first and second side surfaces are formed in the first insulating layer 13.

The first adhesive layer (bonding layer) 21a is formed inside the narrow trench 14a along the first side surface, the bottom surface (of the 14a) and the second side surface.

The first carbon layer 22a is formed on the first adhesive layer 21a.

The first graphene layer 23a is formed on the first carbon layer 22a and is in contact with the first carbon layer 22a. As to the first graphene layer 2a, at least a part of a bottom surface (of the 23a) thereof is in connect with the first carbon layer 22a, and at least a part of a upper surface thereof is in contact with the second insulating layer 25.

The upper surface of the first graphene layer 23a includes a depression in a central portion thereof, a first edge located on the left-hand side of the central portion to be higher than the depression and a second edge located in the right-hand side of the central portion to be higher than the depression. Many of edge portions of the first graphene layer 23a included in the first and second edges are extended in a direction opposite to the bottom surface of the U-shape of the narrow trench 14a (that is, upwards in the stacking direction of the first and second insulating layers 13 and 25). With this structure, may of edge portions of the first graphene layer 23a are in contact with the second insulating layer 25 and the second contact/via 26 at the first and second edges. The second contact/via 26 fills the depression in the central portion of the first graphene layer 23a, and therefore has a reverse convex configuration. Further, it is desirable that the second contact/via 26 is in contact with the entire area of the edge of the first graphene layer 23a, but it may be in contact with only a part thereof. For example, as shown in the figure, one of two edges of the first graphene layer 23a formed in both sides across the depression in the central portion of the first graphene layer 23a may be covered entirely with the second contact/via 26, whereas another edge may be covered partially with the second contact/via 26.

An edge of the first graphene layer 23a faces upward, which is opposite to the bottom surface of the narrow trench 14a from the time when the first carbon layer 22a, which contacts to a catalyst, changes to the first graphene layer 23a as mentioned later. In this manner, it becomes no longer necessary to cut out the edges of the first graphene layer 23a after forming the first graphene layer 23a. That is, the second contact/via 26 can be connected onto the edges of the first graphene layer 23a, without damaging the first graphene layer 23a. Thus, the end of the second contact/via 26 and the edges of the first graphene layers 23a are connected directly to each other, the contact resistance can be further reduced.

This figure illustrates the narrow trench 14a and the thin interconnect 20a are described, but the wide trench 14b and the thick interconnect 20b are similar to those of the narrow trench 14a and the thin interconnect 20a. The first and second graphene layers 23a and 23b each have an ultra-thin film stacked structure in which one to about several tens of sheet-like graphene materials (graphene sheets) are stacked one on another.

Generally, a graphene sheet, when its line width is less than a predetermined width, exhibits an electrical resistance much lower than that of a metal interconnect, for example, a copper interconnect wire, due to quantized conduction by electrons. Therefore, it is desirable to set the line width of a graphene sheet to less than a predetermined width. Note that when the line width of a graphene sheet is a predetermined width or less, the resistance of the graphene sheet is substantially constant regardless of the line width of the graphene sheet.

Figure 6:
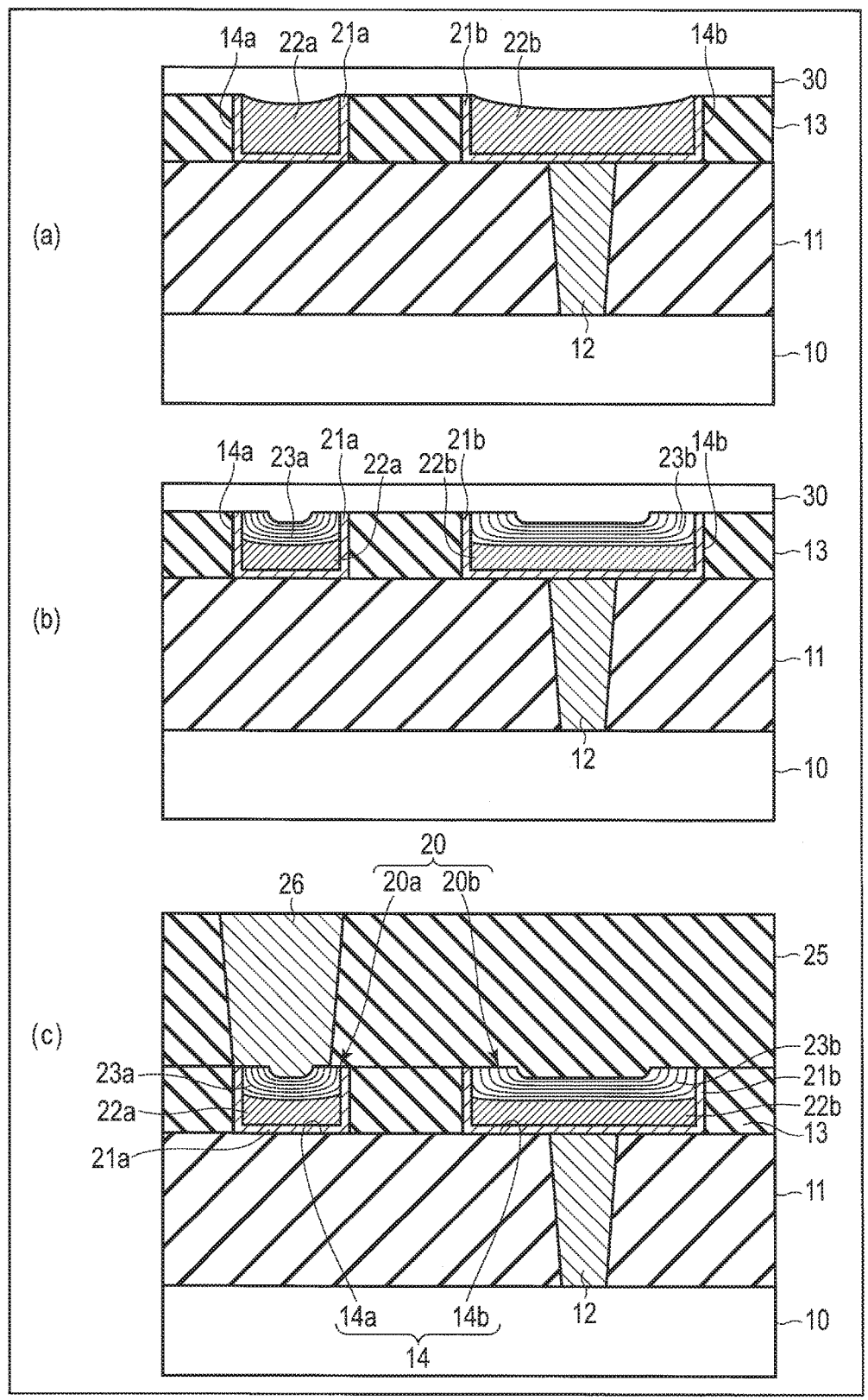

The first and second adhesive layers 21a and 21b are auxiliary layers having functions to prevent the first and second graphene layers 23a and 23b from separating from the first insulating layer 13 (the narrow trench 14a and the wide trench 14b) and also to grow the first and second graphene layers 23a and 23b uniformly. The first and second adhesive layers 21a and 21b prevent the elements contained in the catalyst layer 30 (FIG. 6), described later, from spreading in the underlying layer 11 and the first and second contact/via plugs 12 and 26. The first and second adhesive layers 21a and 21b are of a material which does not easily change the band structure of the graphene sheets, for example, tantalum, titanium, ruthenium, tungsten, aluminum, a nitride, a chloride or an oxide containing one or more of these elements. The first and second adhesive layers 21a and 21b may be of a multilayer structure in which layers containing one or more of these elements are stacked one on another. The first and second adhesive layers 21a and 21b may also contain a dopant to be introduced to the first and second graphene layers 23a and 23b, for example, bromine, cobalt chloride, copper chloride, iron chloride, or an alloy or carbide of these metals. By introducing a dopant into the first and second graphene layer 23a and 23b from the first and second adhesive layers 21a and 21b, it is possible to further reduce the electrical resistance of the first and second graphene layers 23a and 23b.

As shown in the figure, the edges of the first and second graphene layers 23a and 23b face upward with opposite to the bottom surfaces of the narrow trench 14a and the wide trench 14b and form the uppermost surface of the first and second graphene layers 23a and 23b. With this configuration, it is easy to process (modify) the edge surfaces of the first and second graphene layers 23a and 23b. As a result, the difference in the degree of modification between the first and second graphene layers 23a and 23b, caused by the difference in height therebetween can be reduced. In other words, it is possible to reduce the variation in characteristics between the graphene sheets included in the first and second graphene layers 23a and 23b, enabling to easily obtain desired electrical characteristics. When the variation in height between the edges of the graphene sheets is reduced, it becomes possible to prevent the intermingling of the edges of low-resistance graphene sheets and the edges of high-resistance graphene sheets. Therefore, the electrical resistance can be reduced.

Here, the processing (modification) on the edge surfaces is performed to improve the electron transportation characteristics of the graphene sheets.

That is, the processing (modification) on the edge surfaces is to control the configuration of the edges of the graphene sheet, and more specifically, for example, to add some other elements at the edges of the graphene sheets.

Next, the method of manufacturing a semiconductor device according to the first embodiment will be described with reference to FIGS. 5a, 5b-1, 5b-2, 5c and FIGS. 6a, 6b, 6c and FIG. 13.

The wide trench 14b and the thick interconnect 20b shown in FIG. 2 and FIG. 3 correspond to structures 1-1 and 1-2 in FIG. 13. The structures 1-1 and 1-2 are formed through first to fifth manufacturing steps.

Figure 5:
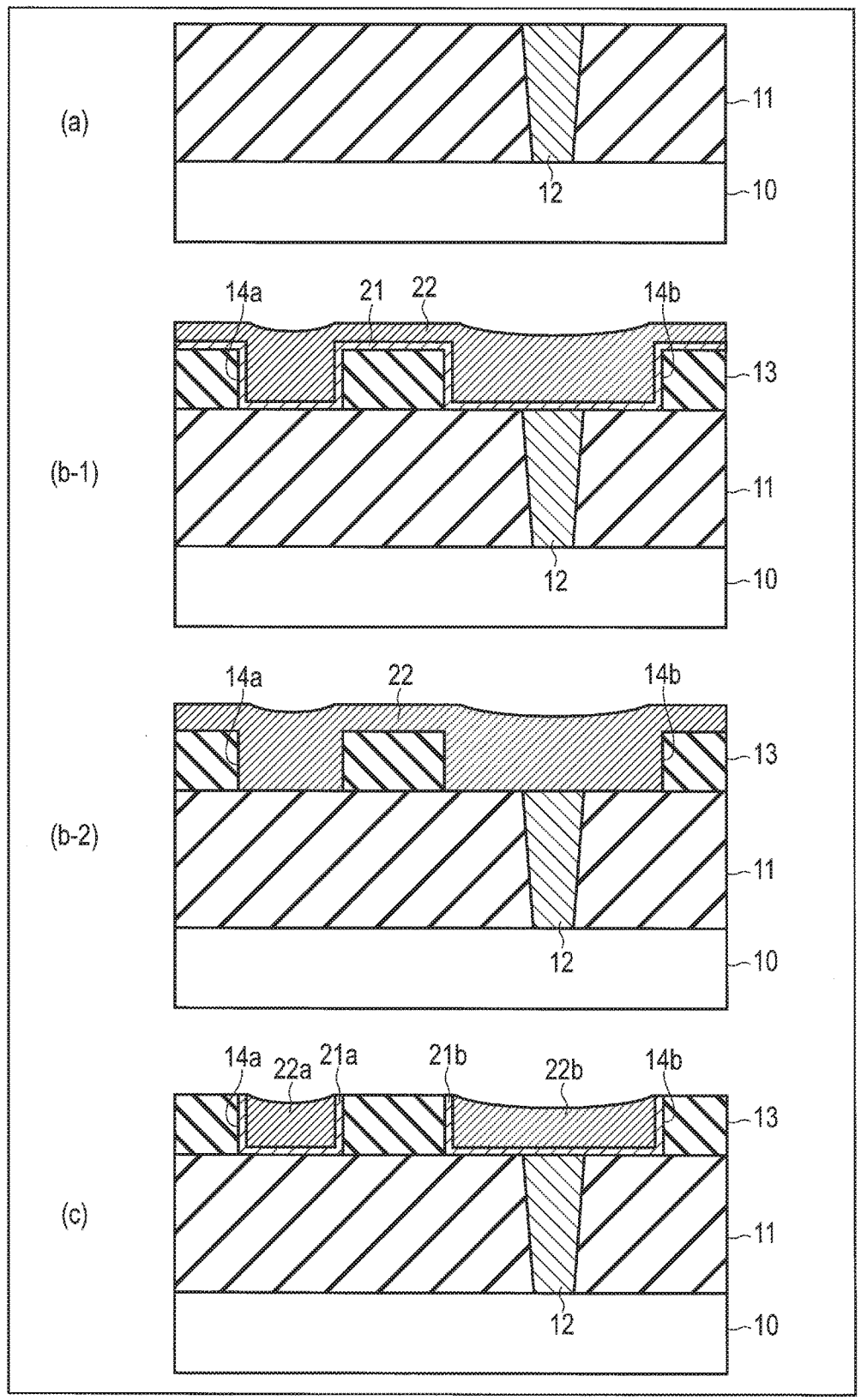
FIGS. 5 and 6 are each a sectional view showing a step in a manufacturing process of the semiconductor device according to the first embodiment.

In the first manufacturing step, as shown in FIG. 5a, the underlying layer 11 is formed on the semiconductor substrate 10 and the first contact/via 12 is embedded in the underlying layer 11.

Next, as shown in FIG. 5b-1, after forming the first insulating layer 13 which covers the first contact/via 12 on the underlying layer 11, the narrow trench 14a and the wide trench 14b are each formed by a damascene process. It is desirable to form the narrow trench 14a and the wide trench. 14b parallel to each other so as not to contact mutually.

Next, in the second manufacturing step, after forming the adhesive layer 21 in the narrow trench 14a and the wide trench 14b, the carbon layer 22 is formed on the adhesive layer 21. The adhesive layer 21 and the carbon layer 22 are formed by chemical vapor deposition (CVD) from a spin-on-carbon (SoC), a resist or the like. At this stage, a dopant to be introduced to the grapheme may be mixed into the adhesive layer 21. But, as shown in FIG. 5b-2, the adhesive layer 21 need not be present.

Next, until the surface of the first insulating layer 13 is exposed, as shown in FIG. 5c, the adhesive layer 21 and the carbon layer 22 are polished by chemical mechanical polishing (CMP), in which chemical and mechanical effects are in synergy with each other, to form the first and second adhesive layers 21a and 21b and the first and second carbon layers 22a and 22b.

Next, in the third manufacturing step, as shown in FIG. 6a, the catalyst layer 30 is formed on the first insulating layer 13 so as to cover the narrow trench 14a, the wide trench 14b, the first and second adhesive layers 21a and 21b, and the first and second carbon layers 22a and 22b. The catalyst layer 30 is a layer necessary to grow graphene. The catalyst layer 30 is formed to fit the form of the first and second carbon layers 22a and 22b, thereby tightly attaching to the surfaces of the first and second carbon layers 22a and 22b. The first and second carbon layers 22a and 22b each include a depression in the central portion, a first edge located in the left-hand side of the central portion higher than the depression and a second edge located in the right-hand side of the central portion higher than the depression. The first and second edges are base points when the grapheme layer 23 grows. That is, the first and a second edges are portions of the first and second carbon layers 22a and 22b most strongly contacting the catalyst layer 30.

The catalyst layer 30 is made from, for example, a simple metal such as cobalt, nickel, iron, ruthenium or copper, or an alloy, a magnetic material or carbide containing one or more of these elements. In order to form the first and second graphene layers 23a and 23h uniformly and continuously, it is necessary to adjust the thickness of the catalyst layer 30 to be a continuous film (for example, 0.5 nm or more).

Next, in the fourth manufacturing step, as shown in FIG. 6b, at least parts of the first and second carbon layers 22a and 22b reacts with the catalyst layer 30 through heating (annealing) and transform into the first and second graphene layers 23a and 23b. The rest of the first and second carbon layers 22a and 22b, without reacting with the catalyst layer 30, may remain in the narrow trench. 14a and the wide trench 14b. Therefore, the first and second graphene layers 23a and 23b are in contact with the first and second carbon layers 22a and 22b, respectively.

Next, in the fifth manufacturing step, as shown in FIG. 6c, the catalyst layer 30 is removed by a wet process or the like. Thus, by placing the removal of the catalyst layer 30 after the formation of the first and second graphene layers 23a and 23b, it is possible to form the first and second graphene layers 23a and 23b without leaving the catalyst layer 30.

Finally, the second insulating layer 25, which covers the narrow trench 14a, the wide trench 14b, the thin interconnect 20a and the thick interconnect 20b, is formed on the first insulating layer 13, and the second contact/via 26 is embedded in the second insulating layer 25. Between the first insulating layer 13 and the second insulating layer 25, a diffusion prevention layer (diffusion barrier) (not shown) of, for example, silicon nitride, may be formed.

Thus, the semiconductor device of the first embodiment is completed.

Hereafter, an example of the growth process of the first graphene layer 23a will be described.

First, the first graphene layer 23a grows toward the bottom surface of the narrow trench 14a from the first edge (or second edge) of the first carbon layer 22a in a direction parallel to the first side surface of the narrow trench 14a (which is perpendicular to the film surface of the first insulating layer 13), to form the first edge of the first graphene layer 23a (first growth). Next, the first graphene layer 23a grows parallel to the bottom surface of the narrow trench 14a (parallel to the film surface of the first insulating layer 13), to form the central portion of the first graphene layer 23a (second growth). Finally, the graphene layer 23 grows in a direction opposite to the bottom surface of the narrow trench. 14a parallel to the second side surface (perpendicular to the film side surface of the first insulating layer 13) until it reaches the second edge of the first carbon layer 22a from the bottom surface of the narrow trench 14a, to form the second edge of the first graphene layer 23a (third growth).

In the meantime, when the first growth and the third growth occurs simultaneously, the first and second edges of the first graphene layer 23a grow from the first and second ends of the first carbon layers 22a parallel to the first side surface of the narrow trench 14a (perpendicular to the film surface of the first insulating layer 13) until reaching the bottom surface of the narrow trench 14a and then they grow parallel to the bottom surface of the narrow trench 14a (parallel to the film surface of the first insulating layer 13), to form the central portion of the first graphene layer 23a (second growth). In other words, both edges of the first graphene layer 23a (the first and second edges of the first graphene layer 23a) extending from both edges of the narrow trench 14a join together on the bottom surface of the narrow trench 14a, to form the central portion of the first graphene layer 23a.

Through such growth processes, the central portion of the first graphene layer 23a and the first and second edges are formed in left-hand side and right-hand side, respectively, across the central portion are formed. Many of the edge portions of the graphene layer 23 included in the first and second edges face upward in the stacking direction of the underlying layer 11 and the first insulating layer 13. With this configuration, many of the edge portions of the first graphene layer 23a included in the first and second edges are in contact with the catalyst layer 30.

The growth process of the second graphene layer 23b is similar to that of the first graphene layer 23a.

Figure 7:
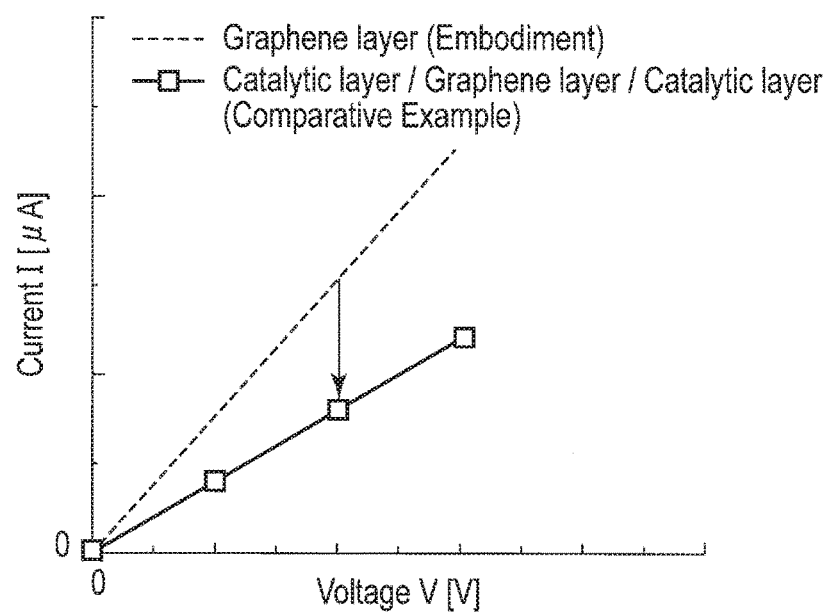
FIG. 7 is a diagram showing I-V characteristics of each of the first embodiment and a comparative example.

FIG. 7 shows the current-against-voltage (I-V) characteristics regarding this embodiment and a comparative example. The dashed line in the figure indicates the I-V characteristics of this embodiment, and the solid line indicates the I-V characteristics of the comparative example.

In this embodiment, a single-layer structure of graphene sheet is used. On the other hand, in the comparative example, a stacked structure in which a graphene sheet is sandwiched between metal elements contained in the catalyst layer 30 is used. The metal elements contained in the catalyst layer 30 are of, for example, nickel, copper or the like.

In the comparative example, the graphene sheet is in contact with the metal elements contained in the catalyst layer 30, and therefore the current value is greatly lower as compared to this embodiment. Thus, if a graphene sheet is brought into contact with metal elements contained in the catalyst layer 30, the electrical resistance of the graphene sheet greatly increases, and the current flowing through the graphene sheet greatly decreases.

In this embodiment, the catalyst layer 30 is removed after forming the first and second graphene layers 23a and 23b, it is possible to obtain such a structure that the first and second graphene layers 23a and 23b are not in contact with the catalyst layer 30. By removal of the catalyst layer 30, the processing of the catalyst layer 30 can be skipped. Further, when a dopant to be introduced to the graphene is contained in the first and second adhesive layers 21a and 21b, the dopant may undesirably cause corrosion of the catalyst layer 30.

However, according to this embodiment, with the removal of the catalyst layer 30, such a drawback can be overcome.

Second Embodiment

Next, the second embodiment will now be described. As in the first embodiment, a semiconductor device of this embodiment is applicable to the latest semiconductor integrated circuit. Note that the basic structure and manufacturing method of this embodiment are the same as those of the first embodiment. Therefore, explanations of the items already described in the first embodiment will be omitted.

Figure 8:
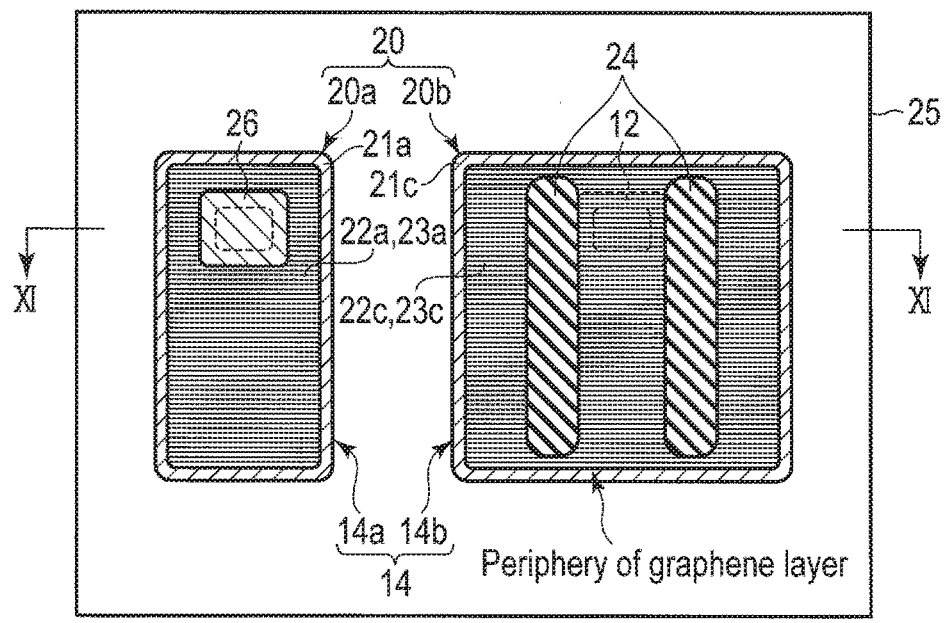
FIGS. 8, 9 and 10 are each a plan view showing a schematic structure of a semiconductor device according to the second embodiment.
Figure 9:
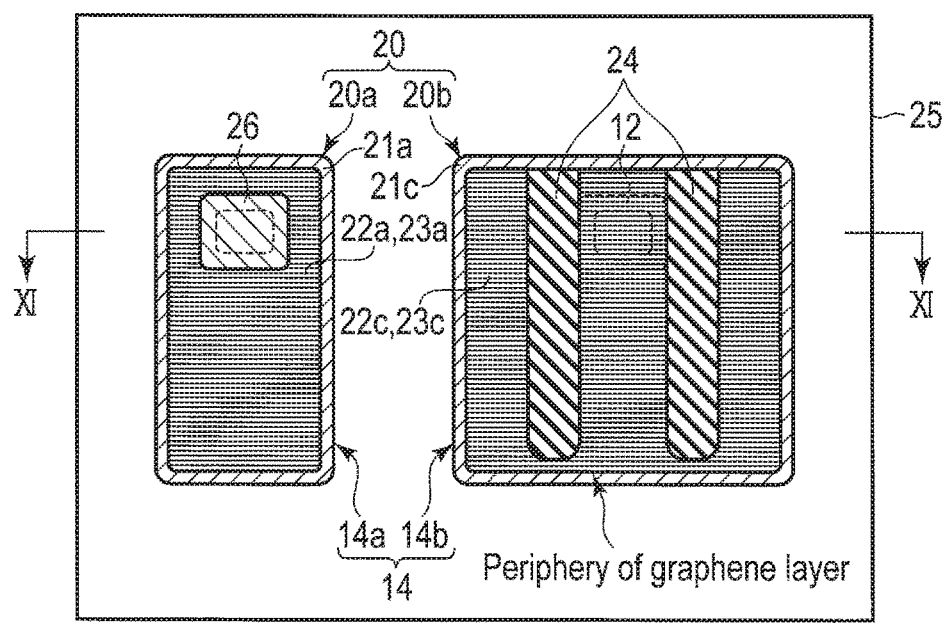
Figure 10:
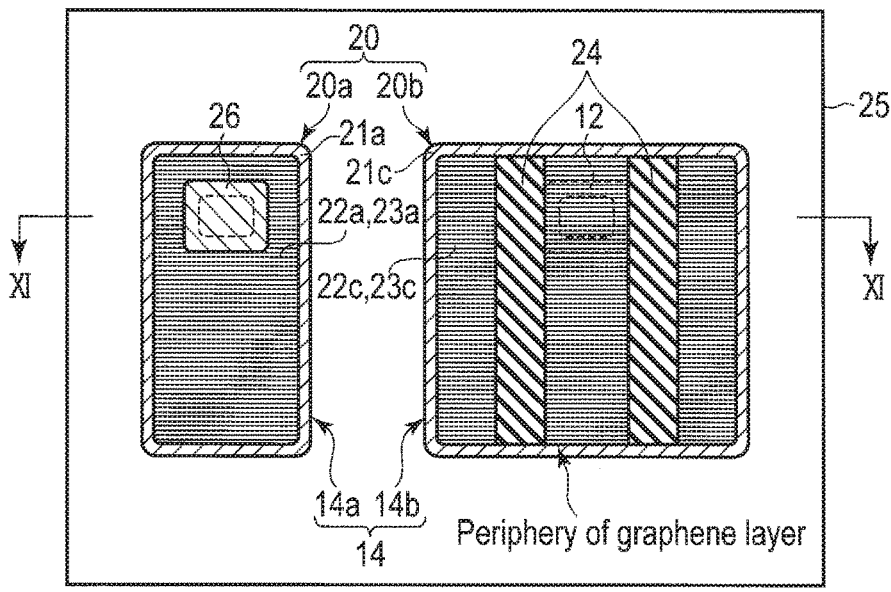
Figure 11:
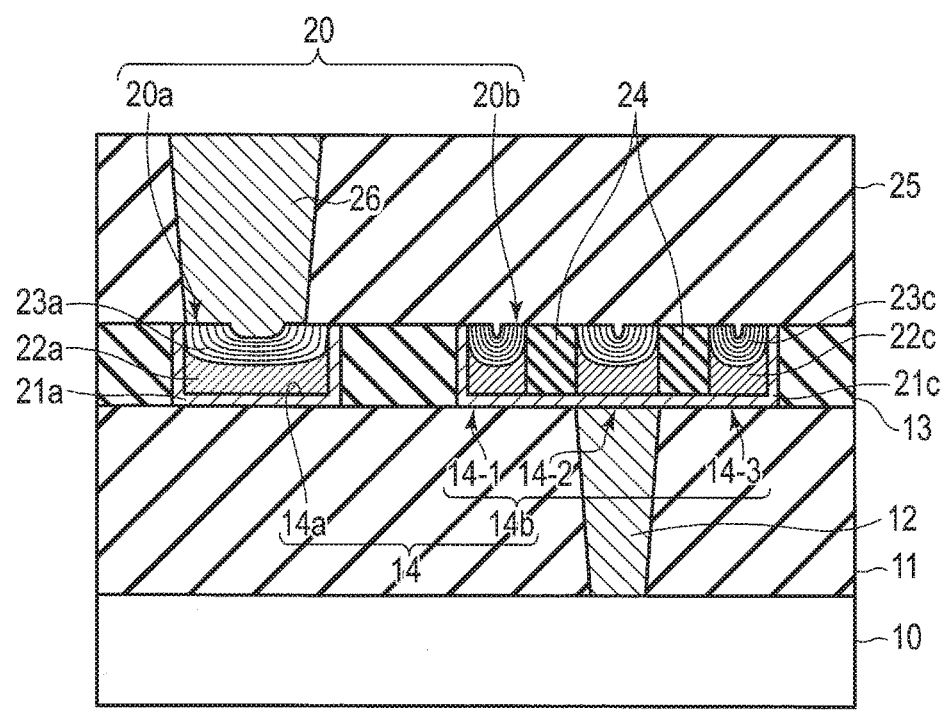
FIG. 11 is a sectional view taken along line XI-XT in FIGS. 8, 9, and 10.

FIGS. 8, 9, and 10 are each a plan view showing a brief structure of a semiconductor device according to the second embodiment. FIG. 11 is a sectional view taken along line XI-XI of FIG. 8.

As shown in the figures, a catalyst layer 30 is removed from the inside of the semiconductor device also in the second embodiment. Further, in the second embodiment, a partition layer 24 is formed in a wide trench 14b to form a third graphene layer 23c having a line width less than a predetermined width in the wide trench 14b. One or more partition layers 24 may be provided to be apart from first and second side surfaces of a wide trench 14b, respectively.

Partition layers 24 divide the wide trench. 14d into a plurality of partition trenches having a trench width less than a predetermined width. Each of the partition trenches comprises a bottom surface formed on an underlying and two side surfaces joined to the bottom surface, formed into a U-shape as the wide trench 14b.

Figure 12:
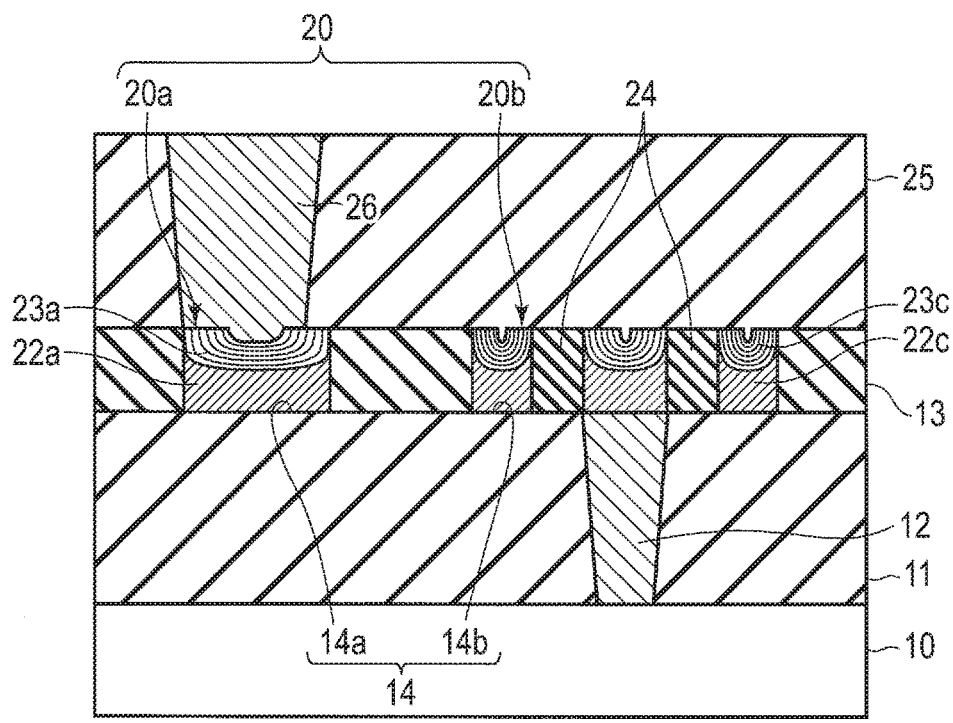
FIG. 12 is a sectional view showing a schematic structure of the semiconductor device according to the second embodiment.

When n (n≥1) partition layers 24 are provided in the wide trench 14b, n+1 partition trenches are formed parallel to each other in the wide trench 14b. For example, when n=2, the wide trench 14b is divided into three partition trenches 14-1, 14-2 and 14-3 by the two partition layers 24. In each partition trench, a third adhesive layer 21c (which may be omitted, see FIG. 12), a third carbon layer 22c and a third carbon layer 22c are formed. The third graphene layer 23c is formed on the third carbon layer 22c, and is in contact with the third carbon layer 22c. The third graphene layer 23c includes a central portion, a first edge located in the left-hand side of the central portion, and a second edge located in the right-hand side of the central portion.

The partition layers 24 may be conductive layers or insulating layers as long as they are formed of a material which inhibits formation of graphene on surfaces of the partition layers 24. For the partition layer 24, for example, tantalum, titanium, ruthenium, tungsten, aluminum, silicon, a nitride or oxide of any of these materials may be used. Further, when a low-resistance material is used for the partition layer 24, it is possible to utilize the partition layers 24 as low-resistance conductor layers. Further, the partition layers 24 may be of the same material as the adhesive layer 21, or of a hard masking material or the like.

The partition layer 24 and the third adhesive layer 21c may contain a dopant material to be introduced into the third graphene layer 23c. In this case, it is possible to dope the third graphene layer 23c with the dopant.

When the partition layers 24 are conductive layers, the third graphene layers 23c function as one interconnect. Similarly, when the third adhesive layer 21c is a conductive material, the third graphene layers 23c function as one interconnect.

Even in the case where both the partition layers 24 and the third adhesive layer 21c are insulators, if a plurality of third graphene layers 23c are at least partially mutually communicated within the wide trench 14b as shown in FIGS. 8 and 9, the third graphene layers 23c function as one interconnect.

Further, if the third graphene layers 23c are isolated completely within the wide trench 14b, and there is no portion contacting mutually among the third graphene layers 23c as shown in FIG. 10, it is desirable that at least one of the partition layers 24 and the third adhesive layer 21c be of a conductive material.

In consideration of such a case where the partition layers 24 are insulators, the partition layer 24 and the first and second contact/via plugs 12 and 26 need to be arranged so as not to block (cover) the first contact/via 12 located under the partition layer 24 or the second contact/via 26 located above the partition layer 24 with the partition layer 24. For example, it is desirable that the first contact/via 12 be formed to bridge over the partition layer 24. In other words, it is desirable to form the third graphene layer 23c on the first contact/via 12.

In the wide trench 14b, a plurality of third graphene layers 23c are formed parallel to each other as electrical conduction layers, the ratio of the sidewalls of the third graphene layers 23c increases. Since the sidewalls of the third graphene layers 23c are regions where quantized conduction of electrons is activated most among the third graphene layers 23c, the electrical resistance of the third graphene layer 23c is further lowered.

Hereafter, the method of manufacturing the semiconductor device according to the second embodiment will now be described with reference to FIG. 13. Note that the thin interconnect 20a in the narrow trench 14a is similar to that of the first embodiment, the explanation thereof is omitted. As in the first embodiment, the second embodiment provides two different structures depending on whether or not the third adhesive layers 21c are present. Further, the second embodiment provides two different structures depending on the timing at which the partition layers 24 are formed.

In the figure, structures 2-1 and 2-2, the partition layers 24 are formed after forming the second graphene layers 23b. In this case, one second graphene layer 23b formed on the entire surface inside the wide trench 14b is divided into a plurality of third graphene layers 23c by the partition layers 24.

In the partition trenches 14-1 and 14-3 located on both edges in the wide trench 14b, many of the edge portions of the third graphene layer 23c formed near the side surfaces of the partition trenches 14-1 and of 14-3 are extended in a direction opposite to the bottom surface (of the 14b, facing upward). On the other hand, many of the edge portions of the third graphene layer 23c formed near in the partition layers 24 are extended in a direction parallel to the bottom surface (of the 14b, facing sideward). Many of the edge portions of the third graphene layer 23c formed in the remaining partition layer 14-2 are extended in a direction parallel to the bottom surface (of the 14b, facing sideward).

The structures 2-1 and 2-2 can be obtained by forming the second graphene layers 23b and removing the catalyst layer 30 in the first to fifth manufacturing steps described in connection with the first embodiment, and thereafter processing the partition layers 24 in the sixth manufacturing step.

An end of each partition layer 24 may be formed on the underlying layer 11 (on the bottom surface of the wide trench 14b) while being through the second adhesive layer 21b, or between the bottom surface of the wide trench 14b and the second adhesive layer 21b, or on the second adhesive layer 21b.

Although there is one addition step of forming the partition layers 24 as compared to the first embodiment, one step can be omitted by incorporating the step of forming the catalyst layer 30 into the second manufacturing step. Note that as for the structure 2-2, the second adhesive layer 21b is not formed in the second manufacturing step.

As for structures 2-3 to 2-5 shown in the figure, the partition layers 24 are formed before forming the graphene layers 23 unlike the case of the structure 2-1 and 2-2. As in the case of the structure 2-1 and 2-2, the structures 2-3 to 2-5 may have such a configuration that an end of each partition layer 24 be formed on the underlying layer 11 (on the bottom surface of the wide trench 14b) while being through the second adhesive layer 21b, or between the bottom surface of the wide trench 14b and the second adhesive layer 21b, or on the second adhesive layer 21b.

Although there is one addition step of forming the partition layers 24 as compared to the first embodiment, one step can be omitted by incorporating the step of forming the catalyst layer 30 into the second manufacturing step. Note that as for the structure 2-4, the second adhesive layer 21b is not formed in the second manufacturing step.

Further, as for in the structure 2-3 and 2-4, the second adhesive layer 21b and the second carbon layer 22b are formed before forming the partition layers 24, whereas with regard to the structure 2-5, the second adhesive layer 21b and the second carbon layer 22b are formed after forming the partition layers 24.

In the case of the structures 2-3 and 2-4, the second adhesive layer 21b and the second carbon layer 22b are formed in the wide trench 14b in the first and second manufacturing steps, and thereafter, the partition layers 24 are formed in the sixth manufacturing step. Then, the third to fifth manufacturing steps are carried out to form the third adhesive layer 21c, the third carbon layer 22c and the third graphene layers 23c in the wide trench 14b successively.

In the case of the structure 2-5, the wide trench 14b is formed in the first manufacturing step, and thereafter the partition layers 24 are formed in the sixth manufacturing step. Then, the second to fifth manufacturing steps are carried out to form the third adhesive layer 21c, the third carbon layer 22c and the third graphene layers 23c are formed in the wide trench 14b successively. As for the structure 2-5, the partition layers 24 are formed on a underlying layer 11 (on the bottom surface of the wide trench 14b) before forming the second adhesive layer 21b, the side walls of the partition layers 24 are covered with the third adhesive layer 21c.

Here, the manufacturing steps for the structures 2-3 and 2-4 will be described with reference to FIG. 14 and FIGS. 15a, 15b, 15c.

First, as in the first embodiment, the first and second adhesive layers 21a and 21b and the first and second carbon layers 22a and 22b are formed in the narrow trench 14a and the wide trench 14b in by the first and second manufacturing steps. In the second manufacturing step, the dopant to be introduced into the third graphene layer 23c may be introduced into the first and second adhesive layers 21a and 21b.

Figure 14:
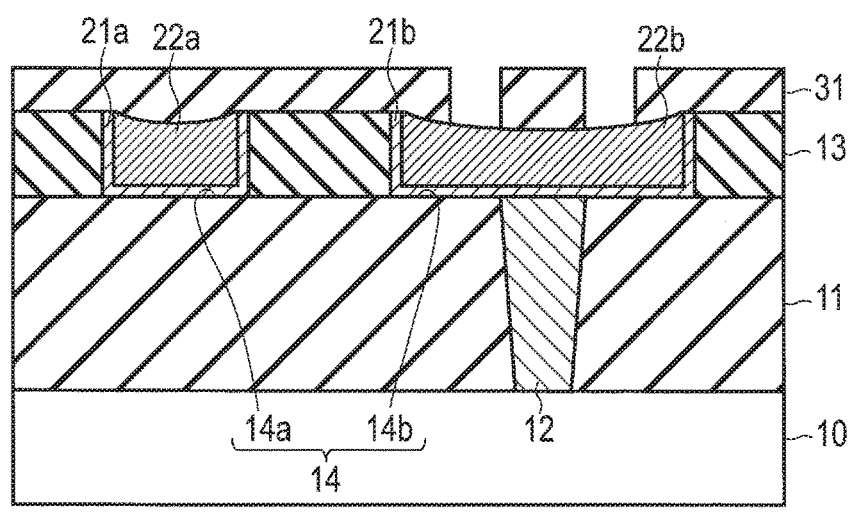
FIGS. 14 and 15 are each a sectional view showing the manufacturing process of the semiconductor device according to the second embodiment.

Next, as shown in FIG. 14, a mask layer 31 is formed on the first insulating layer 13 and the partition layers 24 are formed by patterning in the sixth manufacturing step. In the sixth manufacturing step, the dopant to be introduced into the third graphene layer 23c may be introduced into the partition layer 24. Here, as an example, the partition layers 24 are formed on the second adhesive layer 21b, but the partition layers 24 may be formed through the second adhesive layer 21b and on the underlying layer 11. With the formation of the partition layers 24, the third adhesive layer 21c and the third carbon layer 22c are formed in the wide trench 14b.

Figure 15:
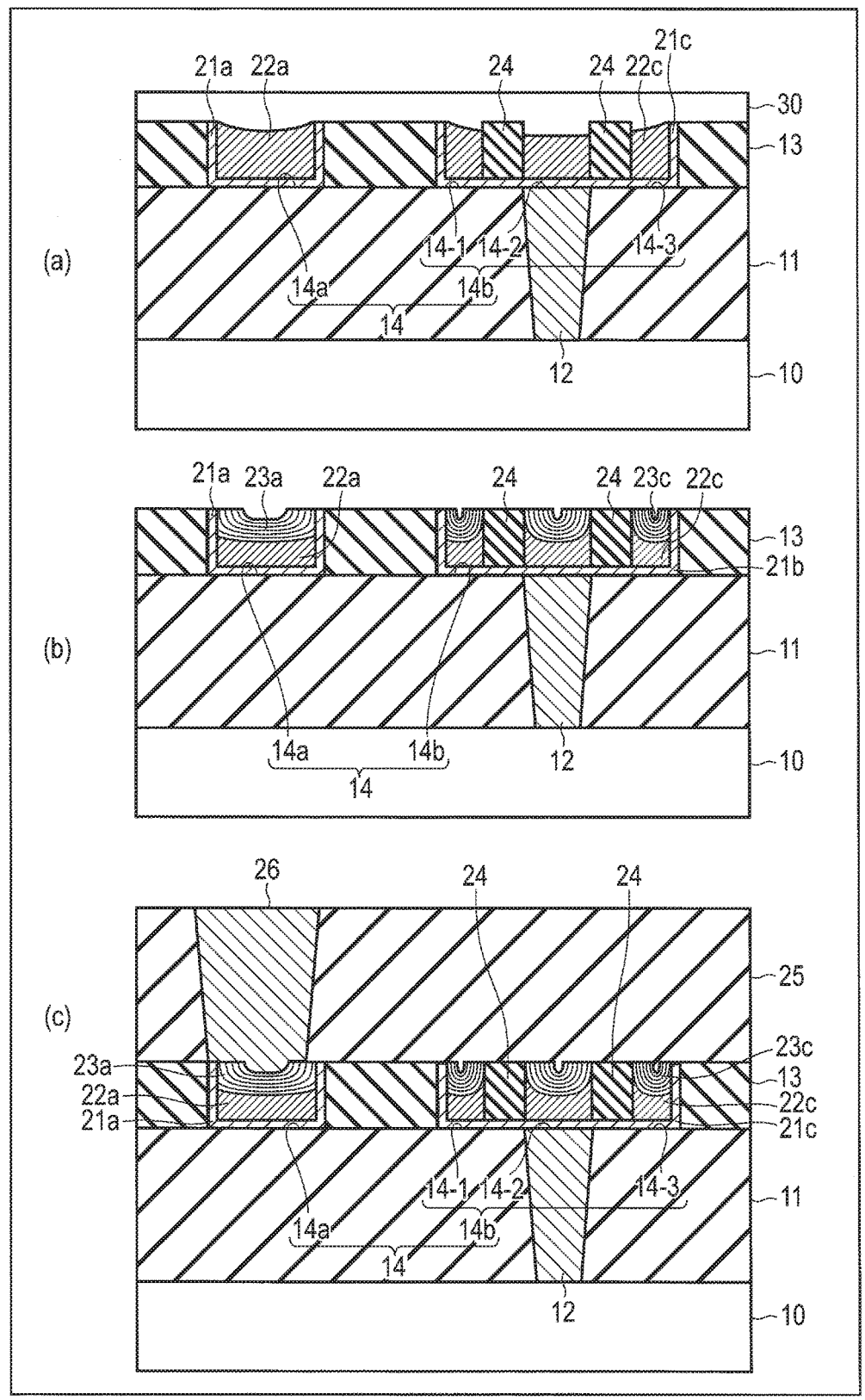

Next, as shown in FIG. 15a, the catalyst layer 30 is formed on the first insulating layer 13 so as to cover the narrow trench 14a, the wide trench 14b, the first and third adhesive layers 21a and 21c and the first and third carbon layers 22a and 22c in the third manufacturing step.

Next, as shown in FIG. 15b, the first and third graphene layers 23a and 23c are formed by annealing in the fourth manufacturing step, and then the catalyst layer 30 is removed in the fifth manufacturing step.

Next, as shown in FIG. 15c, the second insulating layer 25 is formed on the first insulating layer 13 and the second contact/via 26 is embedded in the second insulating layer 25 so as to cover the interconnection structure including the narrow trench 14a, the wide trench 14b, the first and third adhesive layers 21a and 21c, the first and third carbon layers 22a and 22c, and the first and third graphene layers 23a and 23c.

Further, a diffusion prevention layers (diffusion barrier), such as of SiN (not shown) may be formed to cover the interconnection structure.

Note that the manufacturing process discussed here is only an example and may be modified according to the interconnection structure.

As described above, it is also possible in the second embodiment to form graphene sheets, without leaving the catalyst layer 30 as in the first embodiment. Further, in the second embodiment, the partition layers 24 are provided to divide a second graphene layer 23b having a line width greater than a predetermined width into third graphene layers 23c having a line width less than the predetermined. With this structure, it is possible to make the electrical resistance of the thick interconnect 20b further lower as compared to that of the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first insulating layer on an underlying layer;
a first trench formed in the first insulating layer;
a first graphene layer provided in the first trench, wherein
the first trench comprises a bottom surface on the underlying and two side surfaces joined to the bottom surfaces, formed into a U-shape,
the first graphene layer has a stacked structure insulting a plurality of graphene sheets,
the plurality of graphene sheets each include a U-shape and a depression in a central portion,
and portions of the graphene sheets located in an edge of the first graphene layer are each extended upward, which is in a direction opposite to the bottom surface, and
a first carbon layer provided between the underlying layer and the first graphene layer in the first trench,
wherein the first graphene layer and the first carbon layer are in contact with each other.

2. The semiconductor device of claim 1, further comprising: a second insulating layer provided on the first insulating layer and in contact with the portions of the plurality of graphene sheets located in the edge.

3. The semiconductor device of claim 1, further comprising: a first adhesive layer arranged along the bottom surface and the two side surfaces of the first trench.

4. The semiconductor device of claim 2, further comprising: a second contact/via provided in the second insulating layer and in contact with the portions of the plurality of graphene sheets located in the edge, wherein the second contact/via has a reverse convex configuration to fill the depression.

5. The semiconductor device of claim 1, wherein the first graphene layer contains a dopant.

6. The semiconductor device of claim 5, wherein the dopant contains bromine, cobalt chloride, copper chloride, iron chloride or an alloy or carbide containing one or more of these.

7. The semiconductor device of claim 1, further comprising a second trench having a trench width greater than a predetermined width, arranged parallel to the first trench in the first insulating layer, wherein
the second trench comprises a bottom surface on the underlying and two side surfaces jointed to the bottom surface, formed into a U shape.

8. The semiconductor device of claim 7, further comprising a second graphene layer provided in the second trench and a stacked structure including a plurality of graphene sheets, with a width greater than the predetermined width, wherein
the plurality of graphene sheets each include a depression in a central portion,
and portions of the graphene sheets located in an edge of the second graphene layer are each extended upward, which is in a direction opposite to the bottom surface.

9. The semiconductor device of claim 8, further comprising: a second carbon layer provided between the underlying layer and the second graphene layer in the second trench, and having a width greater than the predetermined width,
wherein the second graphene layer and the second carbon layer are in contact with each other.

10. The semiconductor device of claim 7, wherein the predetermined width is 10 nm.

11. The semiconductor device of claim 7, further comprising:
n partition layers arranged parallel to each other in the second trench;
n+1 partition trenches having a trench width less than or equal to the predetermined width, prepared by dividing the second trench thereinto by the n partition layers;
third graphene layers each having a line width less than or equal to the predetermined width and arranged in the n+1 partition trenches, respectively; and
third carbon layers provided respectively between the n+1 third graphene layers and the underlying layer and in contact with the third graphene layers, respectively.

12. The semiconductor device of claim 11, wherein n is 2.

13. The semiconductor device of claim 11, wherein the n+1 third graphene layers are partially in contact with each other in the second trench to function as one interconnect.

14. The semiconductor device of claim 11, wherein the n+1 partition trenches each comprise a bottom surface on the underlying and two side surfaces joined to the bottom surface, formed into a U-shape.

15. The semiconductor device of claim 11, wherein the n+1 third graphene layers each has a stacked structure including a plurality of graphene sheets each including a depression in a central portion, and
portions of the plurality of graphene sheets included in the edge of each of the n+1 third graphene layers are extended upward, which is a direction opposite to the bottom surface.

16. The semiconductor device of claim 11, wherein portions of the plurality of graphene sheets located near the two side surfaces of the second trench, among those included in each of the (n+1)-number of third graphene layers are extended upward, which is a direction opposite to the bottom surface, and the rest of the portions of the plurality of graphene sheets are extended sideward, which is a direction substantially parallel to the bottom surface.

17. The semiconductor device of claim 11, further comprising a first contact/via provided in the underlying layer and electrically connected to the third carbon layers.

* * * * *